US007924114B2

(12) United States Patent
Tsuzuki et al.

(10) Patent No.: US 7,924,114 B2
(45) Date of Patent: Apr. 12, 2011

(54) ELECTRICAL FILTERS WITH IMPROVED INTERMODULATION DISTORTION

(75) Inventors: Genichi Tsuzuki, Ventura, CA (US); Balam A. Willemsen, Newbury Park, CA (US)

(73) Assignee: Superconductor Technologies, Inc., Santa Barbara, CA (US)

( * ) Notice: Subject to any disclaimer, the term of this patent is extended or adjusted under 35 U.S.C. 154(b) by 253 days.

(21) Appl. No.: 12/163,837

(22) Filed: Jun. 27, 2008

(65) Prior Publication Data

US 2009/0002102 A1  Jan. 1, 2009

Related U.S. Application Data

(60) Provisional application No. 60/937,355, filed on Jun. 27, 2007.

(51) Int. Cl.
*H01P 1/203* (2006.01)
*H03H 7/075* (2006.01)
(52) U.S. Cl. .......................... 333/99 S; 333/175
(58) Field of Classification Search .................. 333/99 S, 333/175, 176; 505/210
See application file for complete search history.

(56) References Cited

U.S. PATENT DOCUMENTS

| 5,616,539 | A | 4/1997 | Hey-Shipton et al. |
|---|---|---|---|
| 5,940,749 | A | 8/1999 | Cho et al. |
| 6,026,311 | A | 2/2000 | Cortes et al. |
| 6,633,208 | B2 | 10/2003 | Salkola et al. |
| 7,145,415 | B2 * | 12/2006 | Sengupta et al. ............ 333/174 |
| 7,482,890 | B2 | 1/2009 | Tsuzuki et al. |
| 7,592,882 | B2 * | 9/2009 | Shafer .......................... 333/176 |
| 2005/0164888 | A1 | 7/2005 | Hey-Shipton |
| 2006/0152304 | A1 * | 7/2006 | Liang et al. ................... 333/176 |
| 2006/0202775 | A1 | 9/2006 | Tsuzuki et al. |
| 2007/0247261 | A1 | 10/2007 | Tsuzuki et al. |

OTHER PUBLICATIONS

PCT International Preliminary Report on Patentability (Chapter I of the Patent Cooperation Treaty) for PCT/US2008/068678, Applicant: Superconductor Technologies, Inc., Form PCT/IB/326 and 373, dated Jan. 5, 2010 (7 pages).

Amari, Smain, Synthesis of Cross-Coupled Resonator Filters Using an Analytical Gradient-Based Optimization Technique, IEEE Transactions on Microwave Theory and Technique, vol. 48, No. 9, Sep. 2000, pp. 1559-1564.

(Continued)

*Primary Examiner* — Robert Pascal
*Assistant Examiner* — Alan Wong
(74) *Attorney, Agent, or Firm* — Vista IP Law Group LLP

(57) ABSTRACT

A method of constructing a band-stop filter comprises designing a band-stop filter including a signal transmission path, resonant elements disposed along the signal transmission path, and non-resonant elements coupling the resonant elements together to form a stopband having transmission zeroes corresponding to respective frequencies of the resonant elements. The method further comprises changing the order in which the resonant elements are disposed along the signal transmission path to create different filter solutions, computing a performance parameter for each filter solution, comparing the performance parameters to each other, selecting one of the filter solutions based on this comparison, and constructing the band-stop filter using the selected filter solution. Another RF band-stop filter comprises resonant elements coupled together to form a stopband, wherein at least two of the resonant elements have third order IMD components different from each other, such that the IMD components are asymmetrical about the stopband.

20 Claims, 19 Drawing Sheets

OTHER PUBLICATIONS

Dahm, Thomas, et al., Analysis and Optimization of Intermodulation in High-Tc Superconducting Microwave Filter Design, IEEE Transactions on Applied Superconductivity, vol. 8, No. 4, Dec. 1998, pp. 149-157.

Intermodulation Distortion (IMD) Measurements Using the 37300 Series Vector Network Analyzer, Anritzu Microwave Measurements Division, Sep. 2000, Rev. A. (12pages).

Application Note Intermodulation Distortion, An Insight Intermodulation Distortion Measurement Methods Using the IFR2026A/B Multisource Generator, www.aeroflex.com, Part No. 46891/846, Issue 2, May 2004 (12pages).

Amari et al., In-Line Pseudoelliptic Band-Reject Filters with Nonresonating Notes and/or Phase Shifts, IEEE Transactions on Microwave Theory and Techniques, 2006, (9pages).

PCT International Search Report for PCT/US2008/068678, Applicant: Superconductor Technologies, Inc., Form PCT/ISA/210 and 220, dated Sep. 22, 2008 (4 pages).

PCT Written Opinion of the International Search Authority for PCT/US2008/068678, Applicant: Superconductor Technologies, Inc., Form PCT/ISA/237, dated Sep. 22, 2008 (4 pages).

* cited by examiner

|   | S | 1 | 2 | 3 | 4 | 5 | 6 | 7 | 8 | L |
|---|---|---|---|---|---|---|---|---|---|---|
| S | $B_S^N$ | $J_{01}$ | 0 | 0 | 0 | 0 | 0 | 0 | 0 | 0 |
| 1 | 0 | $B_1^N$ | $J_{12}$ | 0 | 0 | $J_1$ | 0 | 0 | 0 | 0 |
| 2 | 0 | 0 | $B_2^N$ | $J_{23}$ | 0 | 0 | $J_2$ | 0 | 0 | 0 |
| 3 | 0 | 0 | 0 | $B_3^N$ | $J_{34}$ | 0 | 0 | $J_3$ | 0 | 0 |
| 4 | 0 | 0 | 0 | 0 | $B_4^N$ | 0 | 0 | 0 | $J_4$ | $J_{45}$ |
| 5 | 0 | 0 | 0 | 0 | 0 | $B_1^R$ | 0 | 0 | 0 | 0 |
| 6 | 0 | 0 | 0 | 0 | 0 | 0 | $B_2^R$ | 0 | 0 | 0 |
| 7 | 0 | 0 | 0 | 0 | 0 | 0 | 0 | $B_3^R$ | 0 | 0 |
| 8 | 0 | 0 | 0 | 0 | 0 | 0 | 0 | 0 | $B_4^R$ | 0 |
| L | 0 | 0 | 0 | 0 | 0 | 0 | 0 | 0 | 0 | $B_L^N$ |

*Fig. 6*

| 0.0671 | 0.8062 | 0 | 0 | 0 | 0 | 0 | 0 | 0 | 0 |
|---|---|---|---|---|---|---|---|---|---|
| 0 | -0.065 | 0.3262 | 0 | 0 | 0.9585 | 0 | 0 | 0 | 0 |
| 0 | 0 | -0.0218 | 0.1596 | 0 | 0 | 0.6881 | 0 | 0 | 0 |
| 0 | 0 | 0 | 0.0218 | 0.3261 | 0 | 0 | 0.6892 | 0 | 0 |
| 0 | 0 | 0 | 0 | 0.06 | 0 | 0 | 0 | 0.9568 | 0.8051 |
| 0 | 0 | 0 | 0 | 0 | 0.9286 | 0 | 0 | 0 | 0 |
| 0 | 0 | 0 | 0 | 0 | 0 | 0.3944 | 0 | 0 | 0 |
| 0 | 0 | 0 | 0 | 0 | 0 | 0 | -0.3944 | 0 | 0 |
| 0 | 0 | 0 | 0 | 0 | 0 | 0 | 0 | -0.9286 | 0 |
| 0 | 0 | 0 | 0 | 0 | 0 | 0 | 0 | 0 | -0.0746 |

| 0.928596 | 0 | 0 | 0 |
|---|---|---|---|
| 0 | -0.928596 | 0 | 0 |
| 0 | 0 | -0.394362 | 0 |
| 0 | 0 | 0 | 0.394362 |

| 0.996311 | 1.187272 | -1.953525 | -0.255397 | 1.782031 | 1.371621 |
|---|---|---|---|---|---|
| 0 | 2.343431 | -2.327953 | -0.304349 | 2.12359 | 1.634517 |
| 0 | 0 | -0.043083 | 0.115769 | -0.807777 | -0.621742 |
| 0 | 0 | 0 | -0.035977 | -2.500627 | -1.924721 |
| 0 | 0 | 0 | 0 | 2.026945 | 1.256592 |
| 0 | 0 | 0 | 0 | 0 | 0.967193 |

| 0.928596 | 0 | 0 | 0 |
|---|---|---|---|
| 0 | 0.394362 | 0 | 0 |
| 0 | 0 | -0.928596 | 0 |
| 0 | 0 | 0 | -0.394362 |

| 0.369317 | 0.440104 | -1.591893 | -0.538227 | 1.345755 | 1.035822 |
|---|---|---|---|---|---|
| 0 | 1.453054 | -1.897008 | -0.641388 | 1.603694 | 1.234356 |
| 0 | 0 | -0.058376 | -0.153073 | 0.382736 | 0.29459 |
| 0 | 0 | 0 | -0.032856 | -2.239664 | -1.723859 |
| 0 | 0 | 0 | 0 | 0.149437 | 0.41856 |
| 0 | 0 | 0 | 0 | 0 | 0.322164 |

| 0.928596 | 0 | 0 | 0 |
|---|---|---|---|
| 0 | -0.394362 | 0 | 0 |
| 0 | 0 | -0.928596 | 0 |
| 0 | 0 | 0 | 0.394362 |

| 0.996311 | 1.187272 | -1.863373 | -0.639788 | 1.782031 | 1.371621 |
|---|---|---|---|---|---|
| 0 | 2.343431 | -2.220522 | -0.762415 | 2.12359 | 1.634517 |
| 0 | 0 | -0.088041 | 0.105175 | -0.292949 | -0.225482 |
| 0 | 0 | 0 | 0.008981 | -2.611478 | -2.010043 |
| 0 | 0 | 0 | 0 | 2.026945 | 1.256592 |
| 0 | 0 | 0 | 0 | 0 | 0.967193 |

US 7,924,114 B2

ELECTRICAL FILTERS WITH IMPROVED INTERMODULATION DISTORTION

RELATED APPLICATION

This application claims priority from U.S. Provisional Patent Application Ser. No. 60/937,355, filed Jun. 27, 2007, which is expressly incorporated herein by reference.

FIELD OF THE INVENTION

The present inventions generally relate to microwave circuits, and in particular, microwave filters.

BACKGROUND OF THE INVENTION

Electrical filters have long been used in the processing of electrical signals. In particular, such electrical filters are used to select desired electrical signal frequencies from an input signal by passing the desired signal frequencies, while blocking or attenuating other undesirable electrical signal frequencies. Filters may be classified in some general categories that include low-pass filters, high-pass filters, band-pass filters, and band-reject filters, indicative of the type of frequencies that are selectively passed by the filter. Further, filters can be classified by type, such as Butterworth, Chebyshev, Inverse Chebyshev, and Elliptic, indicative of the type of bandshape frequency response (frequency cutoff characteristics) the filter provides relative to the ideal frequency response.

Microwave filters are generally built using two circuit building blocks: a plurality of resonators, which store energy very efficiently at one frequency, $f_0$; and couplings, which couple electromagnetic energy between the resonators to form multiple stages or poles. For example, a four-pole filter may include four resonators. The strength of a given coupling is determined by its reactance (i.e., inductance and/or capacitance). The relative strengths of the couplings determine the filter shape, and the topology of the couplings determines whether the filter performs a band-pass or a band-reject function. The resonant frequency $f_0$ is largely determined by the inductance and capacitance of the respective resonator. For conventional filter designs, the frequency at which the filter is active is determined by the resonant frequencies of the resonators that make up the filter. Each resonator must have very low internal resistance to enable the response of the filter to be sharp and highly selective for the reasons discussed above. This requirement for low resistance tends to drive the size and cost of the resonators for a given technology.

The type of filter used often depends upon the intended use. In communications applications, band-pass filters are conventionally used in cellular base stations and other telecommunications equipment to filter out or block RF signals in all but one or more predefined bands. For example, such filters are typically used in a receiver front-end to filter out noise and other unwanted signals that would harm components of the receiver in the base station or telecommunications equipment. Placing a sharply defined band-pass filter directly at the receiver antenna input will often eliminate various adverse effects resulting from strong interfering signals at frequencies near the desired signal frequency. Because of the location of the filter at the receiver antenna input, the insertion loss must be very low so as to not degrade the noise figure. In most filter technologies, achieving a low insertion loss requires a corresponding compromise in filter steepness or selectivity.

In commercial telecommunications applications, it is often desirable to filter out the smallest possible passband using narrow-band filters to enable a fixed frequency spectrum to be divided into the largest possible number of frequency bands, thereby increasing the actual number of users capable of being fit in the fixed spectrum. Of most particular importance is the frequency ranges of 800-900 MHz range for analog cellular communications, and 1,800-2,200 MHz range for personal communication services (PCS). With the dramatic rise in wireless communications, such filtering should provide high degrees of both selectivity (the ability to distinguish between signals separated by small frequency differences) and sensitivity (the ability to receive weak signals) in an increasingly hostile frequency spectrum.

Historically, filters have been fabricated using normal; that is, non-superconducting conductors. These conductors have inherent lossiness, and as a result, the circuits formed from them have varying degrees of loss. For resonant circuits, the loss is particularly critical. The quality factor (Q) of a device is a measure of its power dissipation or lossiness. For example, a resonator with a higher Q has less loss. Resonant circuits fabricated from normal metals in a microstrip or stripline configuration typically have Q's at best on the order of four hundred. With the discovery of high temperature superconductivity in 1986, attempts have been made to fabricate electrical devices from high temperature superconductor (HTS) materials. The microwave properties of HTSs have improved substantially since their discovery. Epitaxial superconductor thin films are now routinely formed and commercially available.

Currently, there are numerous applications where microstrip narrow-band filters that are as small as possible are desired. This is particularly true for wireless applications where HTS technology is being used in order to obtain filters of small size with very high resonator Q's. The filters required are often quite complex with perhaps twelve or more resonators along with some cross couplings. Yet the available size of usable substrates is generally limited. For example, the wafers available for HTS filters usually have a maximum size of only two or three inches. Hence, means for achieving filters as small as possible, while preserving high-quality performance are very desirable. In the case of narrow-band microstrip filters (e.g., bandwidths of the order of 2 percent, but more especially 1 percent or less), this size problem can become quite severe.

In addition to size and loss considerations, of particular interest to the present inventions is the minimization of intermodulation distortion (IMD), which has become increasingly important in microwave and RF amplifier design. IMD is an undesirable phenomenon that occurs when two or more signals of different frequencies are present at the input of a non-linear device, thereby generating spurious emissions at frequencies different from the desired harmonic frequencies of the filter. The frequencies of the intermodulation products are mathematically related to the frequencies of the original input signals, and can be computed by the equation: $mf_1 \pm nf_2$, where $f_1$ is the frequency of the first signal, $f_2$ is the frequency of the second signal, and m, n=0, 1, 2, 3, .... Intermodulation products are generated at various orders, with the order of a distortion product given by the sum of m+n.

As illustrated in FIG. 1, the second order intermodulation products of two fundamental signals at $f_1$ and $f_2$ will occur at $f_1+f_2$, $f_2-f_1$, $2f_1$, and $2f_2$, and the third order intermodulation products of the two signals at $f_1$ and $f_2$ will occur at $2f_1+f_2$, $2f_1-f_2$, $f_1+2f_2$, $f_1-2f_2$ (or $2f_1\pm f_2$ and $2f_2\pm f_1$), $3f_1$, and $3f_2$, where $2f_1$ is the second harmonic of $f_1$, $2f_2$ is the second harmonic of $f_2$, $3f_1$ is the third harmonic of $f_1$, and $3f_2$ is the third harmonic of $f_2$. While bandpass filtering may be an effective means of eliminating most of the undesired intermodulation products without affecting the inband performance, the third order intermodulation products $2f_1-f_2$, $2f_2-f_1$ are usually too close to the fundamental signals $f_1$, $f_2$ to be filtered out, as shown in FIG. 1. If the intermodulation products are within the passband, filtering becomes impossible.

As a practical example, when strong signals from more than one transmitter are present at the input of a receiver, as is commonly the case in telephone systems, IMD products will be generated. The level of these undesired IMD products is a function of the power received and the linearity of the receiver/preamplifier. As a general rule, the second order intermodulation products will increase at a rate of the input signal squared, and the third order intermodulation products will increase at a rate of the input signal cubed. Thus, second order intermodulation products have an amplitude proportional to the square of the input signal, whereas the third order intermodulation products have an amplitude proportional to the cube of the input signal.

Thus, if two input signals, equal in magnitude, each rise by 1 dB, then the second order intermodulation products will rise by 2 dB, and the third order intermodulation products will rise by 3 dB. Thus, although the levels of third order intermodulation products are initially very small compared to lower order intermodulation products (which generally dominate), the third order intermodulation products grow at higher rates. Therefore, when attempting to increase the power-handling of a non-linear device, such as an amplifier, the third order intermodulation products, which are closest to the passband of interest (i.e., $2f_1-f_2$, $2f_2-f_1$) are the greatest concern.

The exponential effect of the intermodulation products will hold true as long as the device is in the linear region. As shown in FIG. 2, the device goes into compression at a point where the output of the device becomes non-linear with respect to its input. If the output levels of the fundamental signal, second order intermodulation products, and third order intermodulation products are plotted against an input level, there would theoretically be points where the levels of the second and third order intermodulation products intercept the fundamental signal. These points are known respectively as a second order intercept point (SOI) and a third order intercept point (TOI; also known as IP3). It is important note that in practice, this is an unrealistic condition, since the device will saturate long before the intercept point is reached. The input power level at which the intercept points occur is referred to as an IP value. If the exponent of the power dependence of the IMD product is n, the IP value is denoted by $IP_n$. For example, for second order IMD products, the IP value is $IP_2$, and for third order IMD products, the IP value is $IP_3$. The concept of an IMD intercept point has been developed to help quantify a device's IMD performance, with the IMD performance improving as the IP value is higher.

While only small losses occur in many superconducting filters, such filters are inherently nonlinear, which can limit the IP value of, for example, a base-station receiver to values that are too small for certain demanding applications. For example, sometimes conventional superconducting filters cannot be effectively used in wireless telecommunication networks where the base stations are co-located with strong specialized mobile radio (SMR) transmitters for with other cellular/PCS service providers, because the power levels of out-of-band signals from these other systems can be too high and result in IMD that reduces the receiver sensitivity. As a result, the superconducting filters are unable to adequately filter out the undesired out-of-band signals.

The performance of the filter also changes with manufacturing process variations of the resonators and filters. Although some filters might be manufactured to achieve the required filtering capabilities for filtering out competing system out-of-band signaling, many of them would fail in such applications, and are thus sorted out during testing, resulting in low filter manufacturing yields. With respect to HTS technology, the non-linearities of an RF filter, and thus the IMD exhibited by the filter, may be minimized by increasing the size of the filter. However, as discussed above, it is desirable that the size of an HTS filter be minimized as much as possible. There, thus, remains a need to minimize the IMD (thus, maximizing the IP value) of a filter without substantially increasing its size.

SUMMARY OF THE INVENTION

In accordance with a first aspect of the present inventions, a method of constructing a radio frequency (RF) band-stop filter is provided. In one embodiment, the band-stop filter comprises a thin-film quasi-lumped element structure (e.g., made of high temperature superconductor (HTS) material, although other types of filters can be used for the band-stop filter.

The method comprises designing a band-stop filter that includes a signal transmission path having an input and an output, a plurality of resonant elements disposed along the signal transmission path between the input and the output, and a plurality of non-resonant elements coupling the resonant elements together to form a stopband having a plurality of transmission zeroes corresponding to respective frequencies of the resonant elements. In one embodiment, four resonators are used, although any number of plural resonators can be used, e.g., 2, 8, 16, etc.

The method further comprises changing the order in which the resonant elements are disposed along the signal transmission path to create a plurality of filter solutions, computing a performance parameter for each of the filter solutions, and comparing the performance parameters to each other. In one exemplary method, the performance parameter is an intermodulation distortion performance parameter (e.g., third order IMD or third order intercept). The method further comprises selecting one of the filter solutions based on the comparison of the computed performance parameters, and constructing the band-stop filter using the selected filter solution.

In one method, the non-resonator elements take the form of admittance inverters that are coupled in parallel and series to the resonator elements. In this case, a coupling matrix representation of each of the filter solutions are generated, and the performance parameter for each of the filter solutions is computed from the respective coupling matrix representation. The filter design may include nodes respectively between the non-resonant elements coupled in parallel to the resonator elements, nodes respectively between the resonator elements and the non-resonant elements coupled in series to the resonant elements, and nodes at the input and output, wherein each dimension of the coupling matrix includes the nodes. In this case, the method may further comprise reducing each coupling matrix to its simplest form, and determining whether the reduced coupling matrices are different relative to each other. In this manner, the filters solutions can be confirmed to be unique. In another method, two of the band-stop filters can be coupled together in a manner that creates a passband between the respective stopbands.

In accordance with a second aspect of the present inventions, a radio frequency (RF) band-stop filter is provided. In one embodiment, the band-stop filter comprises a thin-film quasi-lumped element structure (e.g., made of high temperature superconductor (HTS) material, although other types of filters can be used for the band-stop filter.

The band-stop filter comprises a plurality of resonant elements coupled together to form a stopband. At least two of the resonant elements have third order intermodulation distortion (IMD) components (e.g., third order IMD products $2f_2-f_1$ and $2f_1-f_2$) different from each other, such that the third order IMD components of the filter are asymmetrical about the stopband. The resonator elements may, e.g., have transmission lines that differ from each other by at least one wavelength, so that the IMD components are asymmetrical.

In accordance with a third aspect of the present inventions, a radio frequency (RF) network is provided. The filter network comprises a band-pass filter configured for creating a passband, and a band-stop filter that includes a plurality of resonant elements coupled together to form a stopband. In one embodiment, the band-stop filter comprises a thin-film quasi-lumped element structure (e.g., made of high temperature superconductor (HTS) material, although other types of filters can be used for the band-stop filter.

At least two of the resonant elements have third order intermodulation distortion (IMD) components (third order IMD products $2f_2-f_1$ and $2f_1-f_2$) different from each other, such that the third order IMD components are asymmetrical about the stopband. In one embodiment, the third order IMD components closest to the passband are decreased (e.g. at least 10 dB). The resonator elements may, e.g., have transmission lines that differ from each other by at least one wavelength, so that the IMD components are asymmetrical. In another embodiment, the filter network further comprises another band-stop filter that includes another plurality of resonant elements coupled together to form another stopband. At least two of the other resonant elements have other third order intermodulation distortion (IMD) components different from each other, such that the other third order IMD components are asymmetrical about the other stopband. In this case, the band-pass filter and the other band-stop filter are coupled together in a manner that sharpens another one of the edges of the passband.

Other and further aspects and features of the invention will be evident from reading the following detailed description of the preferred embodiments, which are intended to illustrate, not limit, the invention.

BRIEF DESCRIPTION OF THE DRAWINGS

The drawings illustrate the design and utility of preferred embodiments of the present invention, in which similar elements are referred to by common reference numerals. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which:

FIG. 6 is a coupling matrix representation of the band-stop filter of FIG. 5;

DETAILED DESCRIPTION OF THE EMBODIMENTS

Figure 1:
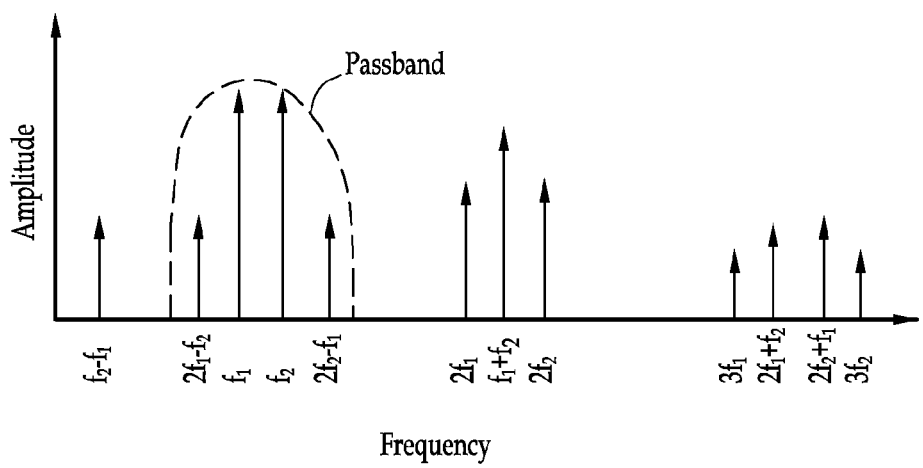
FIG. 1 is a diagram of the intermodulation distortion (IMD) products generated by a prior art filter.
Figure 2:
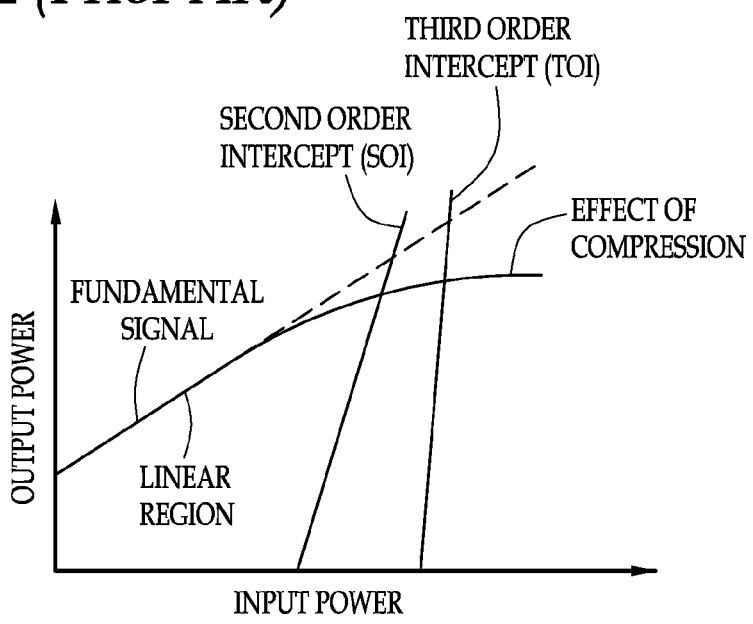
FIG. 2 is a diagram showing the intercept points between IMD components and the fundamental signal of a prior art filter.
Figure 3:
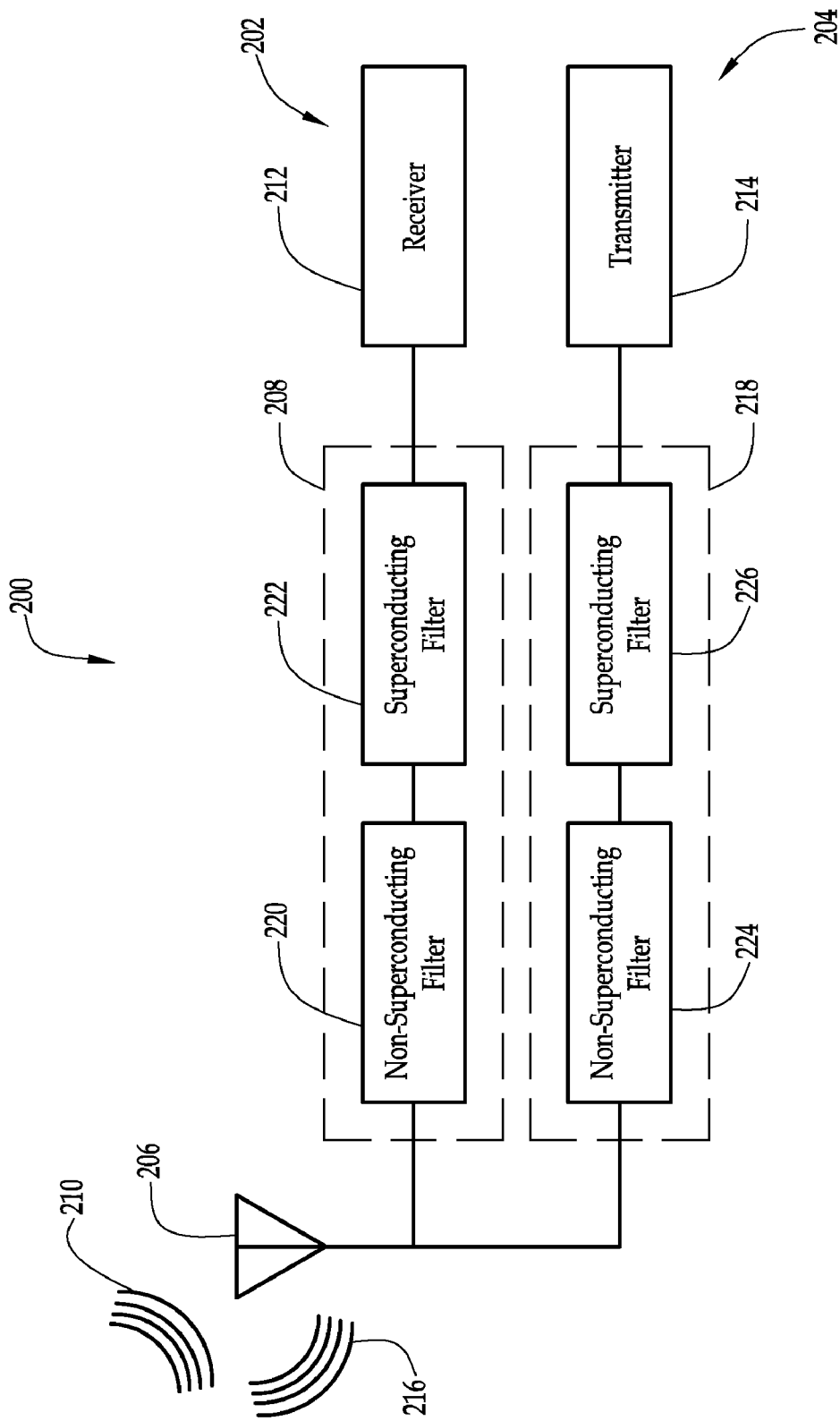
FIG. 3 is a block diagram illustrating a communications system constructed in accordance with one embodiment of the present inventions.

Referring to FIG. 3, one embodiment of a radio frequency (RF) communications system 200 constructed in accordance with the present inventions will now be described. The communications system 200 may be used in, for example, a base station. The communications system 200 generally comprises a front-end receiver system 202, a transmit system 204, and an antenna 206 shared by the receiver and transmit systems 202, 204.

The receiver system 202 comprises a filter network 208 for filtering RF signals 210 received by the antenna 206, and a receiver 212 for receiving the filtered RF signals 210 from the filter network 208. The filter network 208 is used to selectively pass the received RF signals 210 within a designated passband to the receiver 212, while filtering out interfering signals (which typically include RF signals transmitted by other communications systems and co-located transmission signals generated by the transmit system 204) located outside the operating frequency of the receiver 212.

The transmit system 204 comprises a transmitter 214 for generating RF signals 216, and a filter network 218 for filtering the RF signals generated by the transmitter 214 and transmitting these filtered RF signals to the antenna 206. The filter network 218 is used to selectively pass the transmit signals 216 within a designated passband to another receiver (not shown), for example, a cellular telephone, via the antenna 206. When an antenna is not shared by the receive and transmit signals, separate antennas (not shown) can be used for the respective signals.

The filter network 208 of the receiver system 202 comprises a non-superconducting filter 220 and a superconducting filter 222, preferably a High Temperature Superconducting (HTS) filter. The input of the non-superconducting filter 220 receives the RF signals 210 from the antenna 206. The output of the non-superconducting filter 220 is coupled to the input of the superconducting filter 222, and the output of the superconducting filter 222 is coupled to the receiver 212. Thus, the non-superconducting filter 220 pre-filters the received RF signals 210 before they are filtered by the superconducting filter 222.

The non-superconducting filter 220 is a band-pass filter tuned to pass the received RF signals 210 in a passband in the total receiving frequency range of the communications system 200 (e.g., using the Advanced Mobile Phone Service (AMPS) standard, the receiving frequency range is approximately 824 MHz to 849 MHz). The superconducting filter 222 is also a band-pass filter, but is tuned to pass the pre-filtered signals from the non-superconducting filter 220 in a passband located within the passband of the non-superconducting filter 220. In this manner, the non-superconducting filter 220 filters out interfering signals before they are inputted into the superconducting filter 222, while the superconducting filter 220 provides sharp frequency selectivity to the receiver 212.

The filter network 218 of the transmit system 204 comprises a non-superconducting filter 224 and a superconducting filter 226, preferably a High Temperature Superconducting (HTS) filter. The superconducting filter 226 receives the RF signals generated by the transmitter 214. The output of the superconducting filter 226 is coupled to the input of the non-superconducting filter 224, and the output of the non-superconducting filter 224 is coupled to the antenna 206. Thus, the superconducting filter 226 pre-filters the transmit RF signals before they are filtered by the non-superconducting filter 224.

The non-superconducting filter 224 is a band-pass filter tuned to pass the received RF signals 210 in a passband in the total transmitting frequency range of the communications system 200 (e.g., using the Advanced Mobile Phone Service (AMPS) standard, the transmitting frequency range is approximately 869 MHz to 894 MHz). The superconducting filter 226 is a notch or band-stop filter tuned to clip or reject a transmit signal just outside of the desired transmit frequency and then pass the remaining signal to the non-superconducting filter 224. The superconducting filter 226 may clip the transmit signal close to the lower transmit passband edge and/or the higher transmit bandpass edge. Two superconducting filters can be used if the transmit signal is to be clipped at both the lower transmit passband edge and the higher transmit passband edge. By tuning the superconductor filter 226 (or filters) to clip or reject signals at frequencies just outside the passband, the superconductive filter 226 does not need to have the same high power characteristics of the typical bandpass filter used in cellular telephone base station transmitters. As a result, the filter network 218 may exhibit improved loss performance within at least one of the passband edges.

Further details discussing the combined use of non-superconductors and superconductors in a communications system is described in U.S. patent application Ser. No. 11/083,218, entitled "Systems and Methods for Signal Filtering," which is expressly incorporated herein by reference. The following description is directed to a method for improving the intermodulation distortion (IMD), and thus, the third order intercept point (IP3), of a band-stop or notch filter (such as the superconducting filter 226 described above with respect to FIG. 3) without substantially increasing the physical size of the filter.

Figure 4:
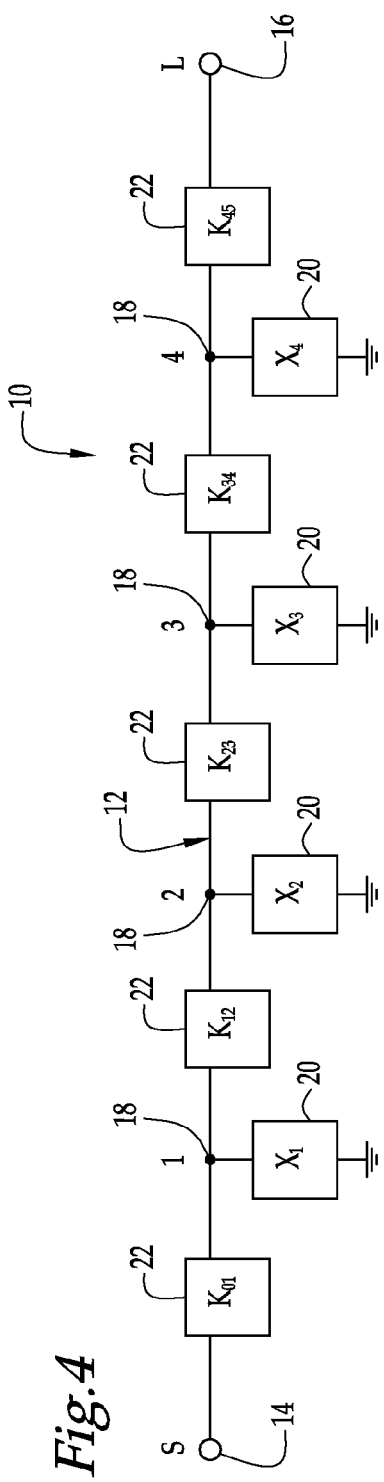
FIG. 4 is a block diagram illustrating one representation of a band-stop filter used in the communications system of FIG. 3.

Referring to FIG. 4, one exemplary method of designing a band-stop filter 10 having these characteristics will now be described. In this method, the band-stop filter 10 can be designed by first creating a coupling matrix representation of the band-stop filter 10 is created. Notably, a coupling matrix representation has become a very powerful tool in the design of very complex band-pass filters, as shown in S. Amari, "Synthesis of Cross-Coupled Resonator Filters Using an Analytical Gradient-Based Optimization Technique," IEEE Trans. Microwave Theory & Tech., Vol. 48, No. 9, pp. 1559-1564, September 2000. Coupling matrix representations have also been applied with great success to low-pass and high-pass filters, but not so extensively to notch or band-stop filters.

Notch or band-stop filters have traditionally been designed using impedance inverters (K) and shunt reactance resonators (X). In particular, as shown in FIG. 4, one representation of the band-stop filter 10 generally comprises a (1) signal transmission path 12 having an input 14 (labeled S) and an output 16 (labeled L); (2) a plurality of nodes 18 (in this case, four nodes respectively labeled 1-4) disposed in series along the signal transmission path 12; (3) a plurality of resonant elements 20 (in this case, four shunt reactance resonators respectively labeled $X_1$, $X_2$, $X_3$, and $X_4$) coupled between the respective nodes 18 and ground; and (4) a plurality of non-resonant elements 22 (in this case, five impedance inverters respectively labeled $K_{01}$, $K_{12}$, $K_{23}$, $K_{34}$, and $K_{45}$) coupled in series between the input 14 and output 16, such that the nodes 18 are respectively between the non-resonant elements 22.

Figure 5:
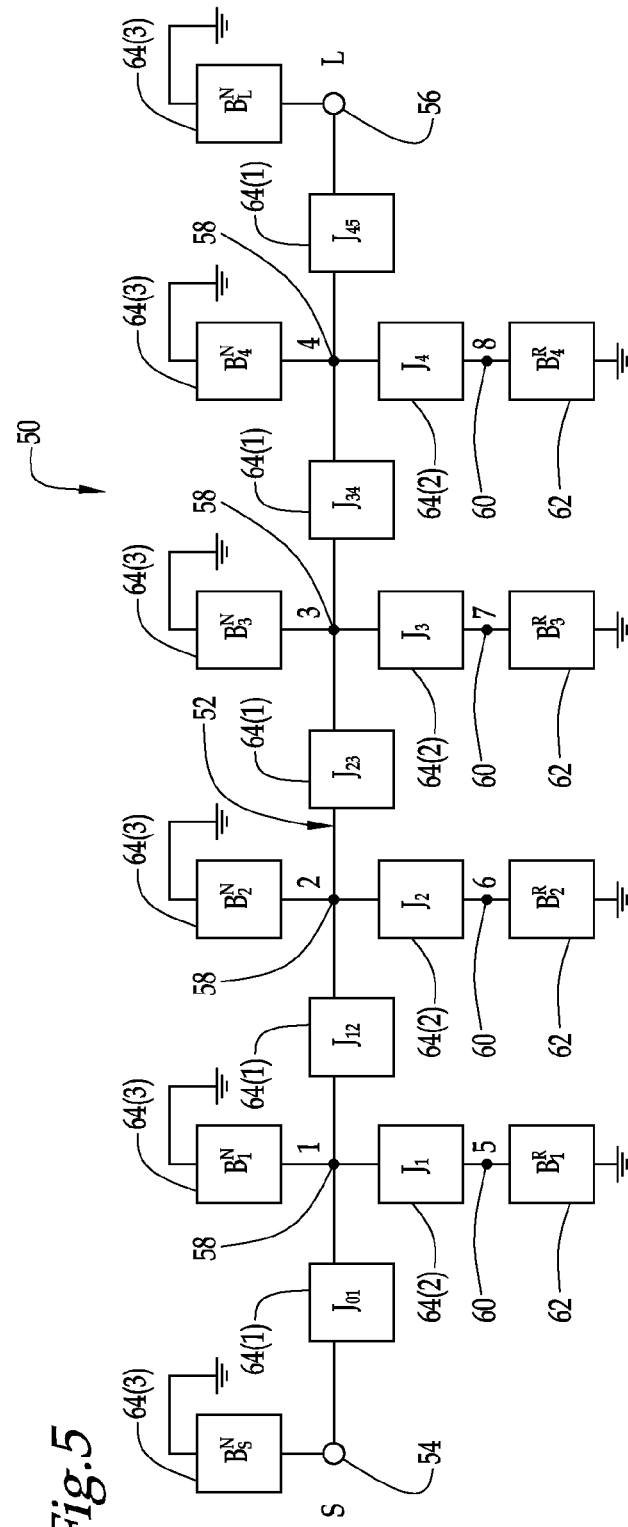
FIG. 5 is a block diagram illustrating another representation of the band-stop filter of FIG. 4 constructed in accordance with the present inventions.

In order to realize the filter 10, the representation illustrated in FIG. 4 can be expanded into the generalized representation of a filter 50 illustrated in FIG. 5, where the series elements are admittance inverters (J) and the resonators are represented as shunt susceptances (B)). In particular, this representation of the band-stop filter 50 generally comprises (1) a signal transmission path 52 having an input 54 (labeled S) and an output 56 (labeled L); (2) a plurality of non-resonant nodes 58 (in this case, four nodes respectively labeled 1-4) disposed in series along the signal transmission path 52; (3) a plurality of resonant nodes 60 (in this case, four nodes respectively numbered 5-8) disposed between the respective non-resonant nodes 58 and ground; (4) a plurality of resonant elements 62 (in this case, four shunt reactance resonators respectively labeled $B_1^R$, $B_2^R$, $B_3^R$, and $B_4^R$) coupled between the respective non-resonant nodes 58 and ground; (5) a first plurality of non-resonant elements 64(1) (in this case, five admittance inverters ($J_{01}$, $J_{12}$, $J_{23}$, $J_{34}$, and $J_{45}$) coupled in series between the input 54 and output 56, such that the non-resonant nodes 58 are respectively between the non-resonant elements 64; (6) a second plurality of non-resonant elements 64(2) (in this case, four admittance inverters ($J_1$, $J_2$, $J_3$, and $J_4$) coupled in series with the resonant elements 62 between the respective non-resonant nodes 58 and the respective resonant nodes 60; and (7) a third plurality of non-resonant elements 64(3) (in this case, six susceptances ($B_S^N$, $B_1^N$, $B_2^N$, $B_3^N$, and $B_4^N$, and $B_L^N$)) coupled in parallel with the resonant elements 62 between the respective input 54, non-resonant nodes 58, and output 56, and ground.

In the illustrated method, the signal transmission path 52 takes the form of a transmission line, and the resonant elements 62 are quasi-lumped element electrical components, such as inductors and capacitors, and in particular, thin-film quasi-lumped structures, such as planar spiral structures, zigzag serpentine structures, single coil structures, and double coil structures. Such structures may include thin film epitaxial high temperature superconductors (HTS) that are patterned to form capacitors and inductors on a low loss substrate. Further details discussing high temperature superconductor quasi-lumped element filters are set forth in U.S. Pat. No. 5,616,539, which is expressly incorporated herein by reference.

FIG. 6 illustrates the coupling matrix representation of the filter 50, as represented in FIG. 5. As there shown, the nodes S, 1-8, and L are on the left and top sides of the matrix representation, with the coupling values (susceptance values (B) and admittance inverter values (J)) between the respective nodes forming the body of the coupling matrix representation. Because the coupling matrix representation is reciprocal, the values below the diagonal of the matrix representation are set to "zero."

The coupling matrix representation shown in FIG. 6 can be divided into four matrix blocks, represented by:

$$m = \begin{bmatrix} m^{(C)} & m^{(Q)} \\ m^{(Q)} & m^{(R)} \end{bmatrix},$$

where $m^{(C)}$ is a non-resonant matrix block containing the susceptance values for non-resonant elements $B_1N$, $B_2N$, $B_3N$, and $B_4N$ and the admittance inverter values for non-resonant elements $J_{12}$, $J_{23}$, $J_{34}$, and $J_{45}$; $m^{(Q)}$ is a non-resonant matrix block containing the admittance inverter values for non-resonant elements $J_1$, $J_2$, $J_3$, and $J_4$; and $m^{(R)}$ is a resonant matrix block containing the susceptance values for resonant elements $B_1^R$, $B_2^R$, $B_3^R$, and $B_4^R$. As is customary, the values in the matrix representation are normalized to a frequency range of −1 to 1.

Figures 7, 8:
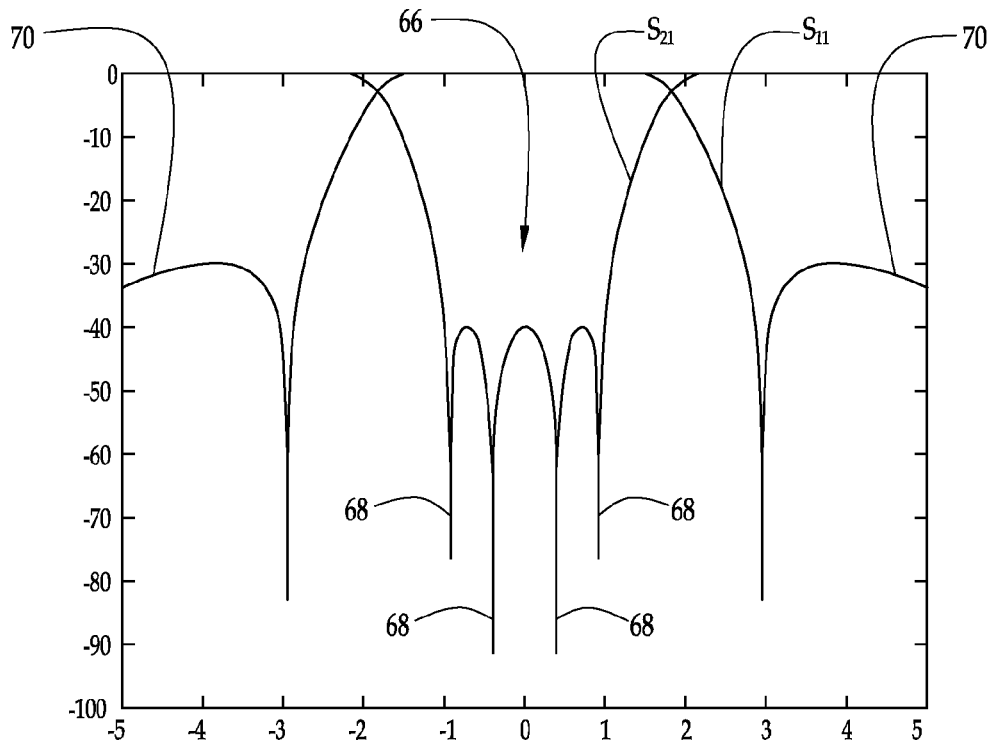
FIG. 7 the coupling matrix of FIG. 6 filled in with exemplary coupling values.
FIG. 8 is a diagram showing the frequency response of the fundamental signal output from the band-pass filter of FIG. 5 constructed in accordance with the coupling matrix of FIG. 7.

Using exemplary values provided in the coupling matrix representation of FIG. 7 generates the filter response illustrated in FIG. 8, which illustrates the input reflection coefficient $S_{11}$ of the frequency response, and the forward transmission coefficient $S_{21}$ of the frequency response. This filter response was modeled in accordance with the following equations:

$$S_{11}(s) = \frac{F(s)}{E(s)}, \quad S_{21}(s) = \frac{P(s)}{\varepsilon E(s)}, \quad |E|^2 = |F|^2 + \frac{|P|^2}{\varepsilon^2},$$

where $S_{11}$ is the input reflection coefficient of the filter, $S_{21}$ is the forward transmission coefficient, s is the normalized frequency, F and P are N-order polynomial (where N is the number of resonant elements) of the generalized complex frequency s, and $\varepsilon$ is a constant that defines equal ripple return loss. Each of the coefficients $S_{11}$ and $S_{21}$ is capable of having up to an N number of zero-points, since the numerator has an Nth order. When both of the coefficients $S_{11}$, $S_{21}$ have all N zero-points, the filter response is considered fully elliptic. Further details discussing the modeling of filters are set forth in "Microstrip Filters for RF/Microwave Application," Jia-Shen G. Hong and M. J. Lancaster, Wiley-Interscience 2001. The normalized frequency, s=iw can be mapped into real frequency in accordance with the equation:

$$w = \frac{f_c}{BW}\left(\frac{f}{f_c} - \frac{f_c}{f}\right),$$

where f is the real frequency, $f_c$ is the center frequency, and BW is the bandwidth of the filter. Further details discussing the transformation of normalized frequency into real frequency are set forth in "Microwave Filters, Impedance-Matching Networks, and Coupling Structures," G. Matthaei, L. Young and E. M. T. Jones, McGraw-Hill (1964).

As can be appreciated from FIG. 8, the non-resonant elements 64 couple the resonant elements 62 in a manner that forms a stopband 66 having a plurality of transmission zeroes 68 corresponding to the respective frequencies of the resonant elements 62 (in this case, four transmission zeroes 68 respectively corresponding to the frequencies of the four resonant elements 62). In this particular example, the transmission zeroes 68 are positioned at 0.9286, 0.3944, −0.3944, and −0.9286 in the normalized frequency range, thereby creating a stopband 66 having a normalized frequency range of −1 to 1. As shown in FIG. 8, the filter response also includes a pair of reflection zeroes 70 visible over the normalized frequency range of −5 and 5.

Significantly, the positions of the four transmission zeroes 68 are replicated exactly in the resonant matrix block of the expanded coupling matrix. The order of the transmission zeroes 68 is not specified, so a class of reduced solutions is possible simply be selecting the order of the transmission zeroes 68 in the resonant matrix block. That is, the frequencies of the four resonant elements 62 may remain the same, but their order along the signal transmission path 52 may be changed. As will be described below, at least one performance parameter (in this case, the third order intermodulation distortion components) can be computed for each of the matrix solutions, so that the solution (i.e., the ordering of the resonant elements 62) that achieves the best performance can be selected, and used to physically construct the band-stop filter 50. The remaining coupling values in the expanded coupling matrix can be modified accordingly to generate the same magnitude filter response for each order of resonant elements 62.

To confirm that the different orders of resonant elements 62 used will produce unique solutions, the corresponding coupling matrices generated for the different resonant element orders can be reduced down to their simplest form. In particular, the coupling matrix representation generated in the manner shown in FIG. 6 will have (2N+2)×(2N+2) matrix elements, where N is the number of resonant elements 62 used to generate the coupling matrix. In this case, the number of matrix elements is ((2)(4)+2)×((2)(4)+2)=100.

As shown in FIG. 7, the expanded coupling matrix is relatively sparse in that many of the matrix elements have values of zero. Using standard matrix manipulation, the expanded coupling matrix may be reduced to matrices having (N+2)×(N+2)=(4+2)×(4+2)=36 matrix elements. Although the resonant frequency values in the reduced coupling matrices no longer correlate with the positions of the transmission zeroes 68, and therefore, are not very useful when realizing circuits, they do provide a clear indication that two expanded matrices do not simply reduce to the same solution.

For example, FIGS. 9a-9h illustrate the expected electrical current levels flowing through non-resonant elements $J_1$-$J_4$ (at resonant nodes 5-8) plotted against the normalized frequency for eight coupling matrix representations with different transmission zero orders. For each electrical current plot, the order of the transmission zeroes are provided above it and the reduced matrix is shown below it. As can be seen, the node currents are different for each of the different transmission zero orders. Notably, between two matrices, the node currents for transmission zeroes of the same frequency will differ if they have a different order, and will be the same if they have the same order. As such, the transmission zeroes can be treated as independent design parameters.

Figure 9A:
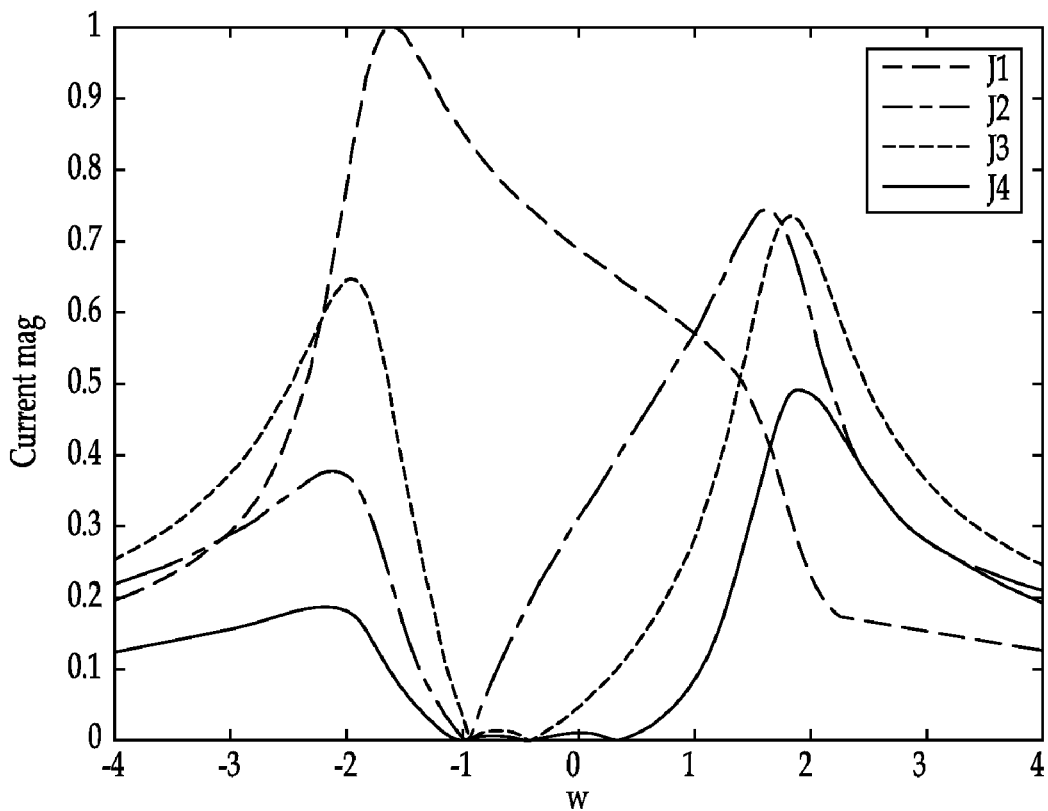
FIGS. 9a-9h each illustrates a resonator matrix block (top), frequency response of the electrical nodal current (middle), and reduced coupling matrix (bottom), wherein a different resonator order is used within the band-stop filter of FIG. 5.
Figure 9B:
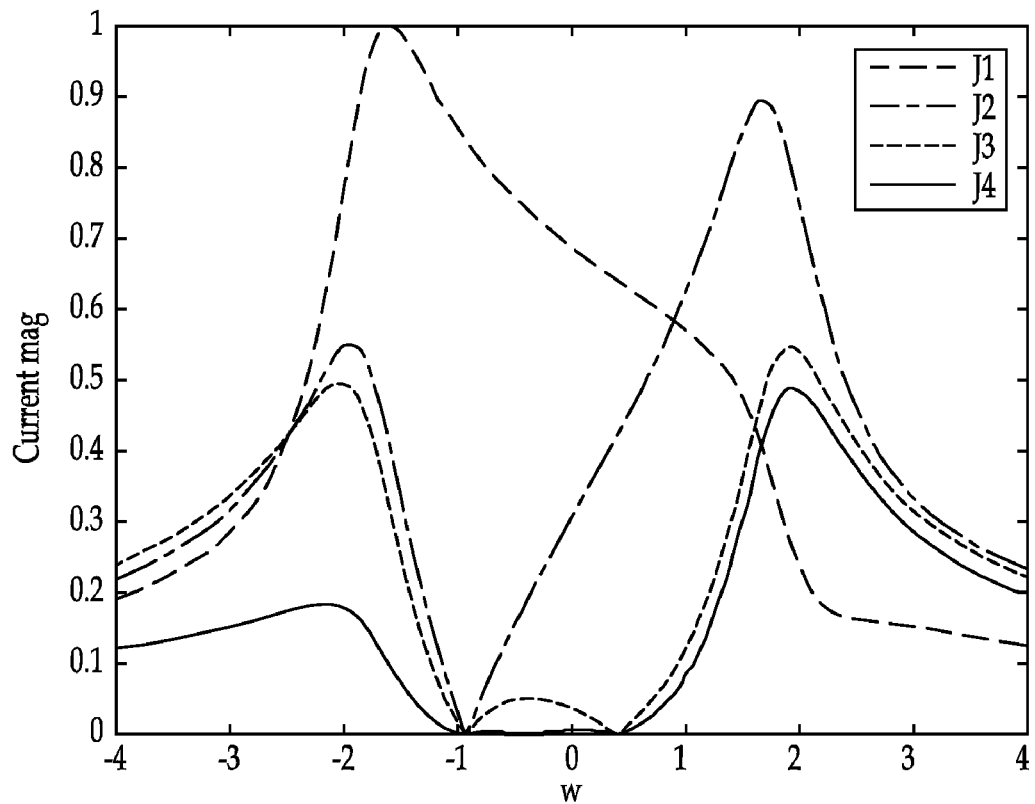
Figure 9C:
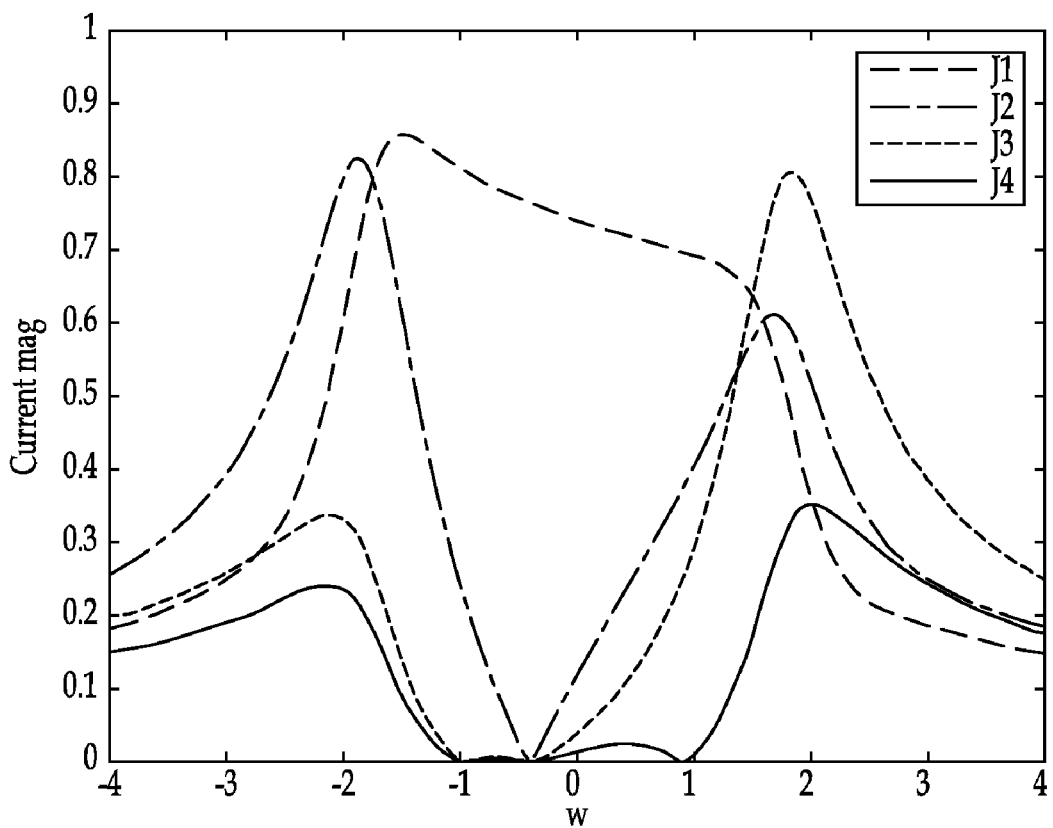
Figure 9D:
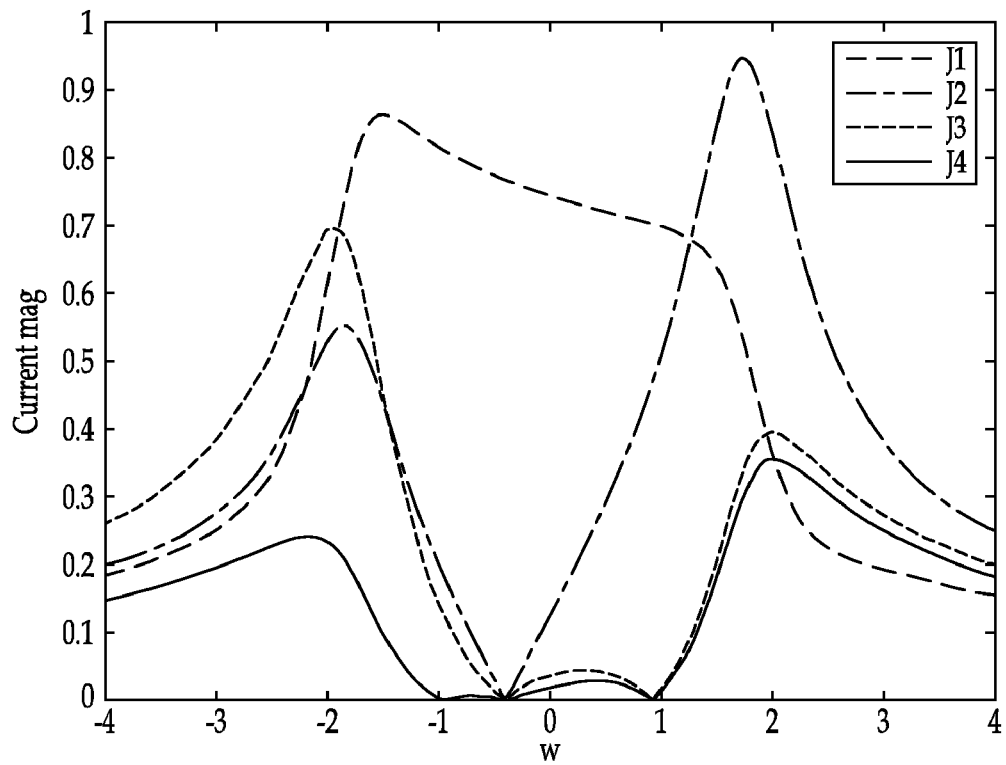
Figure 9E:
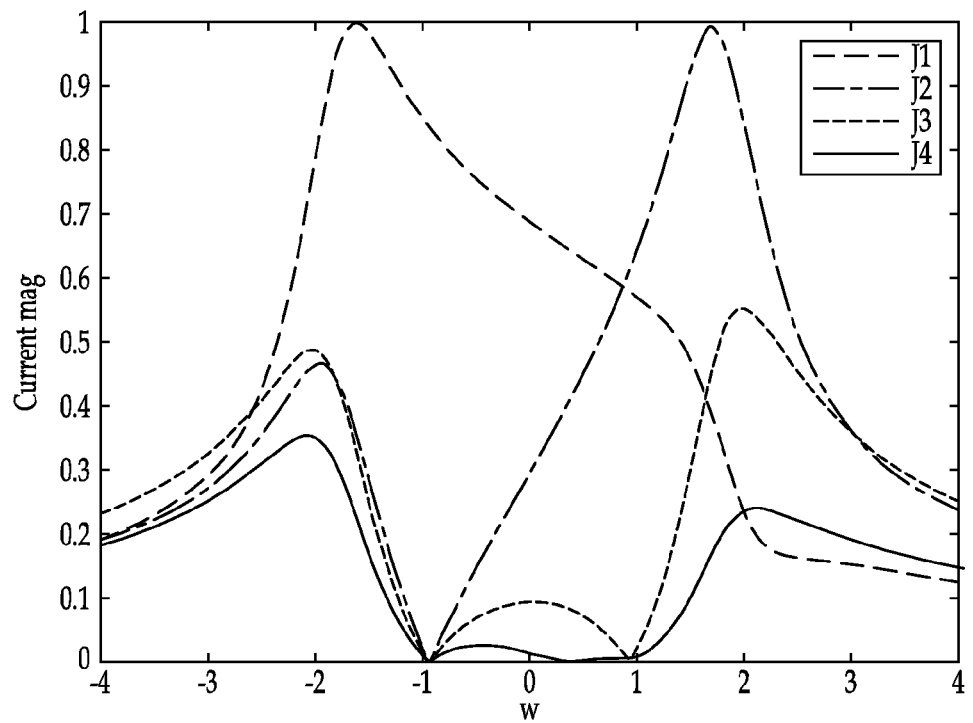
Figure 9F:
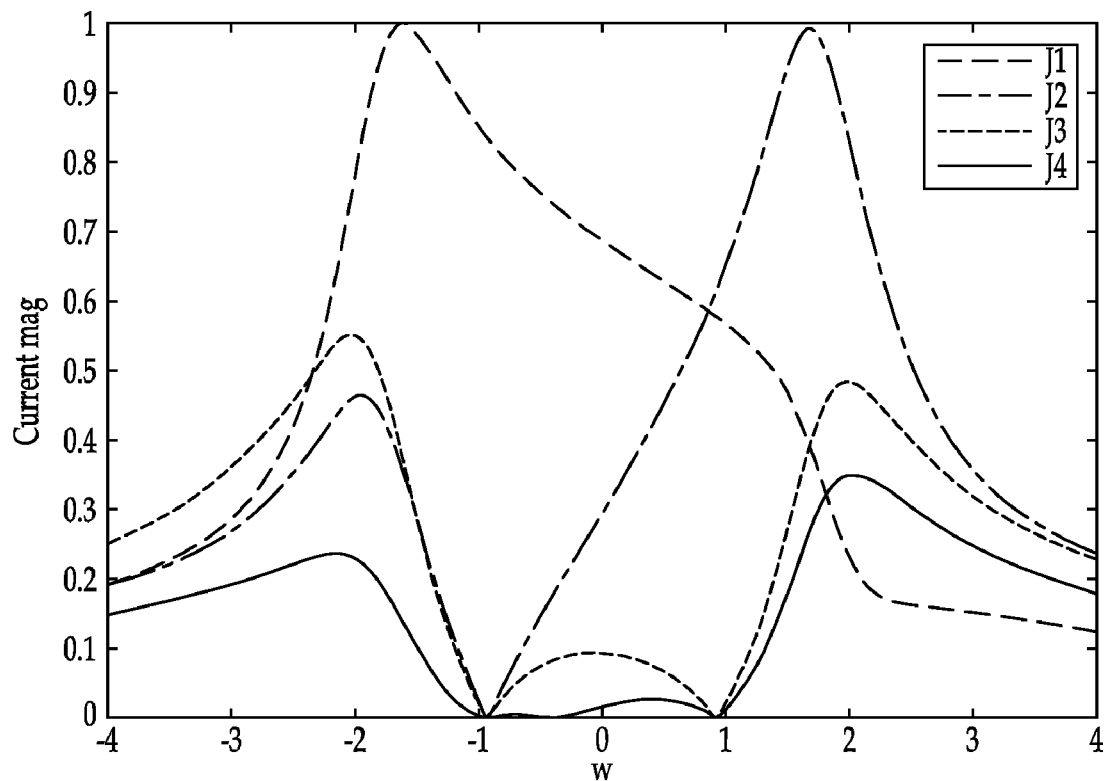
Figure 9G:
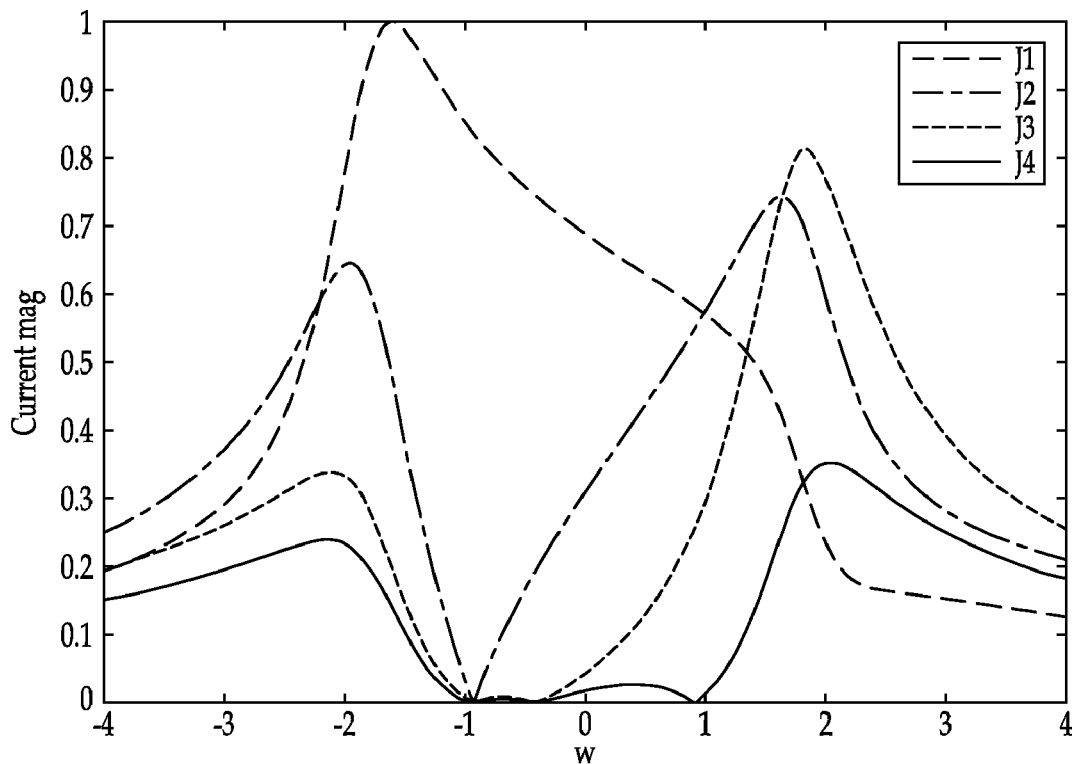
Figure 9H:
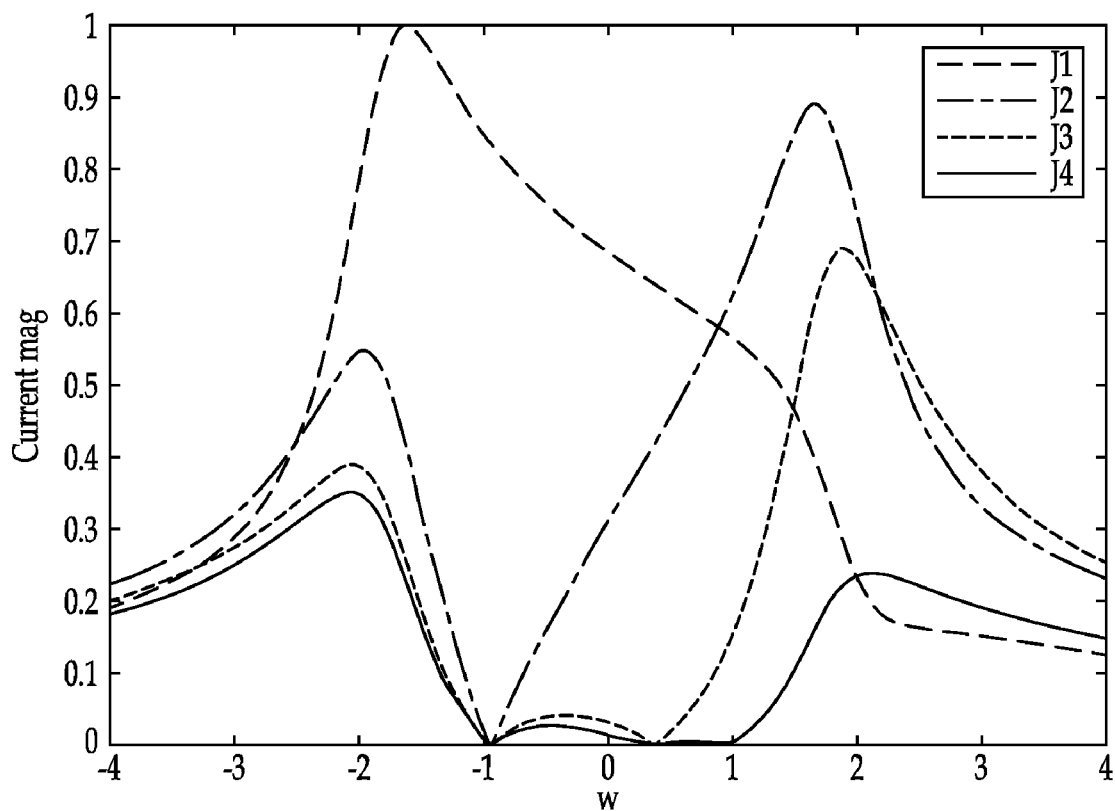

For example, the J1 electrical current frequency response (node 5) and the J4 electrical current frequency response (node 8) in the resonator order arrangement shown in FIG. 9a is the same as the J1 electrical current frequency response (node 5) and the J4 electrical current frequency response (node 8) in the resonator order arrangement shown in FIG. 9b, since the first resonator $B_1^R$ of both arrangements have the same frequency (i.e., 0.928596) and the fourth resonator $B_4^R$ of both arrangements have the same frequency (−0.928596). In contrast, the J2 electrical current frequency response (node 6) and the J3 electrical current frequency response (node 7) in the resonator order arrangement shown in FIG. 9a differs from the J3 electrical current frequency response (node 6) and the J3 electrical current frequency response (node 7) in the resonator order arrangement shown in FIG. 9b, since the second resonator $B_2^R$ of both arrangements have different frequencies (i.e., 0.394362 and −0.394362), and the third resonator $B_2^R$ of both arrangements have different frequencies (i.e., −0.394362 and 0.394362).

Using standard techniques described in Dahm T., et al., "Analysis and Optimization of Intermodulation in High-Tc Superconducting Microwave Filter Design," IEEE Transactions on Applied Superconductivity, vol. 8, No. 4, December, 1998, pp. 149-157 and U.S. Pat. No. 6,633,208, which are expressly incorporated herein by reference, the computed node currents can be used to predict both raw power handling and intermodulation distortion (IMD) for filters constructed in accordance with the coupling matrix representations.

Figure 10A:
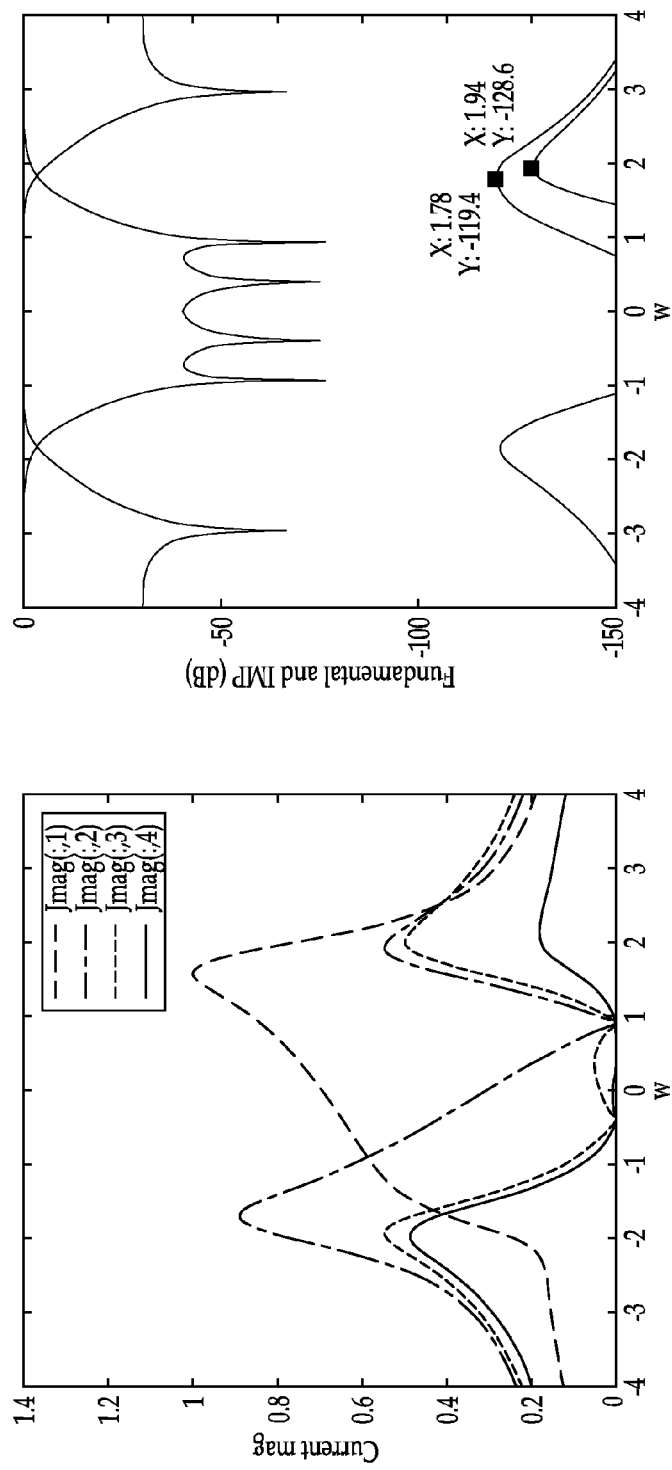
FIGS. 10a and 10b each illustrates a reduced coupling matrix (top), frequency response of the electrical current in the resonators (left), and frequency response of the fundamental signal and third order IMD, wherein a specific resonator order is used within the band-stop filter of FIG. 5.
Figure 10B:
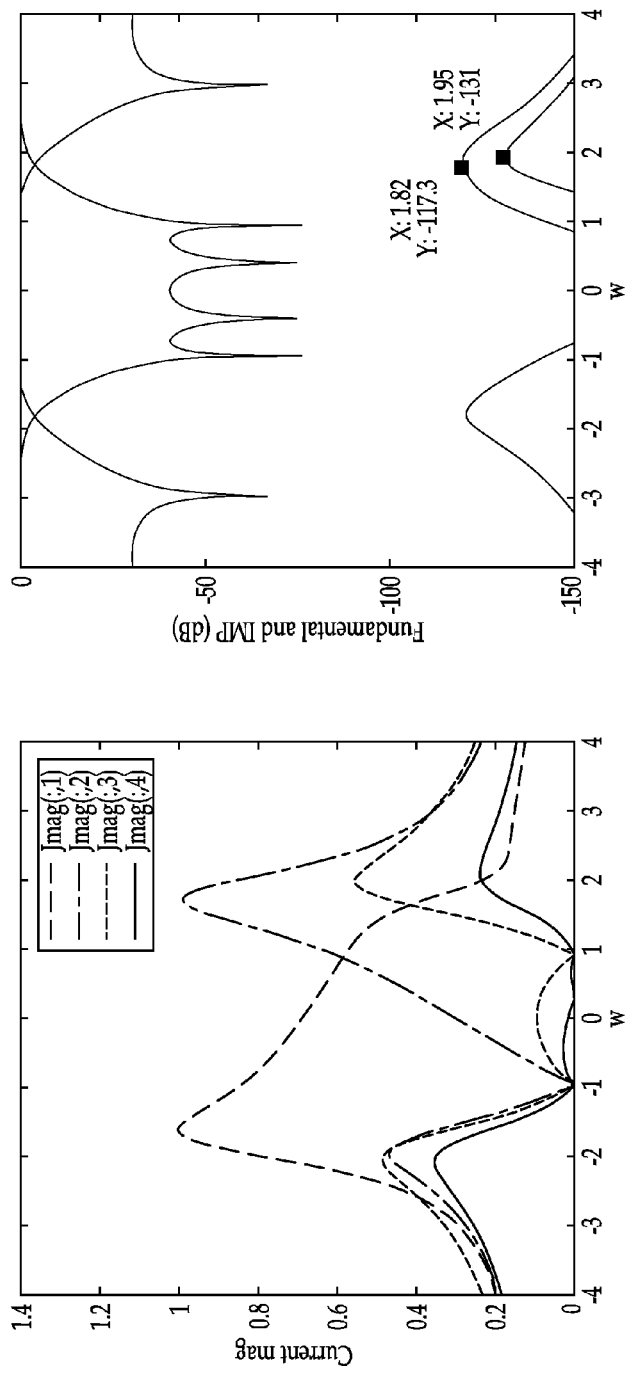

Referring to FIGS. 10(a) and 10(b), the node current frequency response, fundamental signal frequency response, and the IMD ($3^{rd}$ order) frequency response were computed for two expanded coupling matrices with different resonator orders are shown along with the corresponding reduced matrices. Assuming that the band-stop filter 50 will serve as a notch filter to form the low frequency side of a band-pass filter, the third order IMD components for the respective resonator frequencies above the band-stop (and in particular, the IMD at $2f_2-f_1$ and $2f_1-f_2$) will be the most significant. As can be seen, the values for these IMD components are respectively −119 dBm and −128 dBm for the configuration in FIG. 10(a), and respectively −117.3 dBm and −131 dBm for the resonator configuration in FIG. 10(b).

As can be appreciated from this, the resonator ordering used in the configuration of FIG. 10(a) may be selected in physically constructing the filter, since its worst case IMD is less than the worst case IMD for the resonator ordering used in the configuration of FIG. 10(b). Thus, it can be appreciated that changing the order in which the resonant elements 62 are disposed along the signal transmission path 52 to create several filter solutions, and then selecting the best filter solution (e.g., the one that provides the best IMD (and power handling)) for the construction of the band-stop filter 50 based on a comparison of the IMD yielded by the filter solutions, significant improvements can be made in the IMD (and power handling) performance to be achieved with only modest changes to the filter.

Another manner in which to improve the IMD performance, and thus the power handling performance, is to independently design the resonant elements 62 in the band-stop filter 50 in a manner that provides a third order IMD frequency response that is asymmetrical about the band-stop. This is especially useful when one or two of the band-stop filters 50 are used to sharpen one or both of the lower and upper bandpass edges, as described above with respect to FIG. 3. Significantly, the IMD performance required on one side of the stopband may not be as critical as the IMD performance required on the other side of the stopband. For example, the IMD performance required on the side of the stopband that is closest to the passband may be more critical than the IMD performance required on the side of the stopband that is further from the passband. Furthermore, the IMD performance required on one side of the passband may not be as critical as the IMD performance required on the other side of the passband. For example, there may be more interference on the high side of the passband that needs to be filtered out of the signal as opposed to the interference on the low side of the passband.

Figure 11:
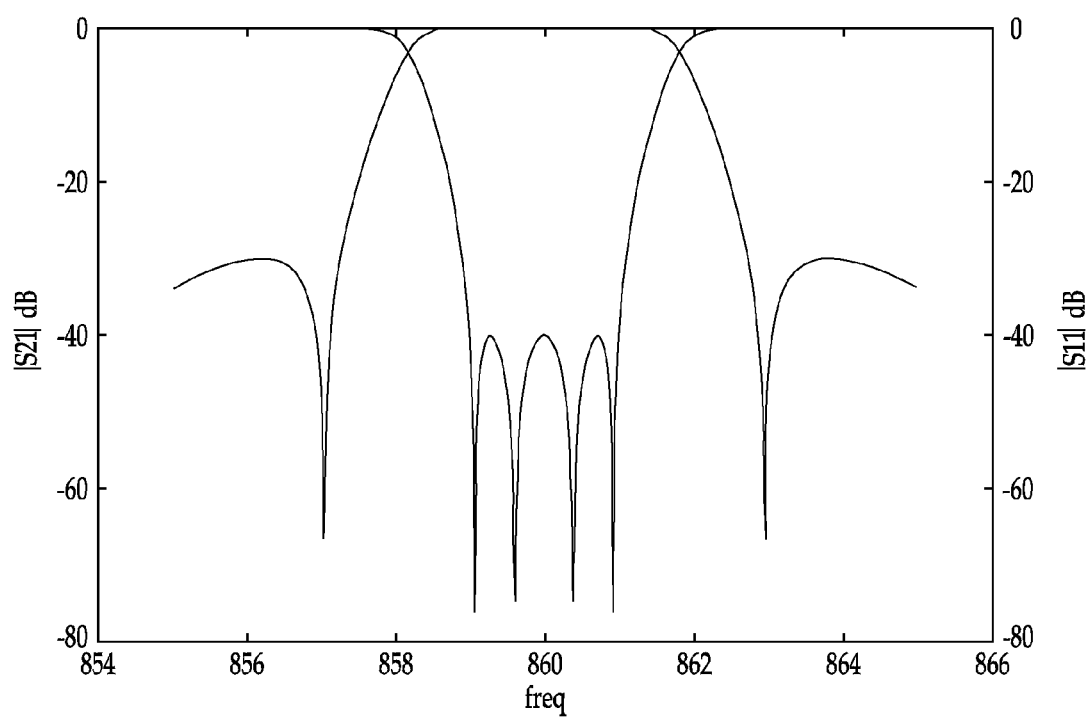
FIG. 11 is the computed frequency response of the band-stop filter of FIG. 5 designed at 860 MHz and 2 MHz bandwidth.

As one example, when the band-stop filter 50 illustrated in FIG. 5 was designed to operate at 860 MHz with a 2 MHz bandwidth, the input reflection coefficient $S_{11}$ of the filter and the forward transmission coefficient $S_{21}$ of the frequency response for the fundamental signal was computed as shown in FIG. 11.

Figure 12:
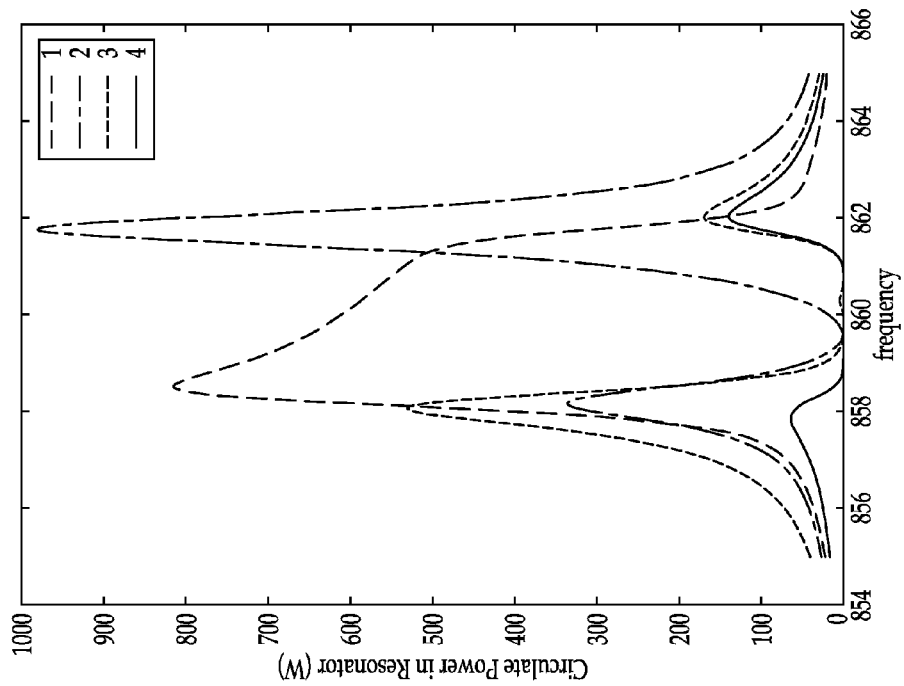
FIG. 12 is the computed frequency response of the resonator currents within the band-stop of FIG. 11, wherein the resonators are identical.
Figure 13:
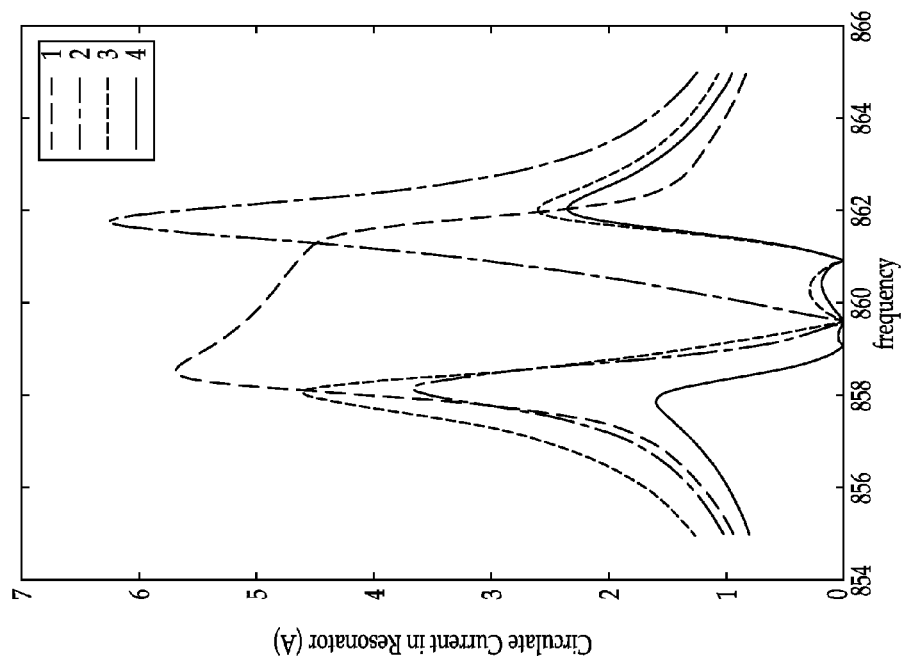
FIG. 13 is the computed frequency response of the resonator powers within the band-stop of FIG. 11, wherein the resonators are identical.

In a conventional manner, the resonant elements 62 in the filter 50 were first designed to be identical, each formed of half-wavelength transmission line at the resonant frequency. The electrical current flowing and the power within the respective resonators were computed for the conventional filter in response to a 1 W input signal $P_{in}$. The computed current within the respective resonators was plotted against the frequency, as illustrated in FIG. 12. Similarly, the computed power within the respective resonators was plotted against the frequency, as illustrated in FIG. 13. As shown in FIGS. 12 and 13, the current and power is highest in the second resonator $B_2^R$.

Notably, although resonators in conventional filters are designed so that each resonator has the same performance (e.g., loss (Q) and IMD performance), individual resonators may experience some variations during manufacturing, but these variations have not been considered desirable. However, in a new technique, one of the resonant elements 62 in the filter 50, and in particular, the second resonator $B_2^R$, was modified using a two wavelength transmission line. It is known that the longer the transmission line used to create a resonator, the more power-handling capability the resonator will have. Alternatively, any of the resonators used in U.S. Pat. No. 6,026,311, which is expressly incorporated herein by reference, can be used to improve the power-handling capability of the filter. The electrical current flowing and the output power within the respective resonators were computed for the modified filter in response to a 1 W input signal $P_{in}$. The computed powers within the respective resonators were plotted against the frequency, as illustrated in FIG. 14.

Figure 15:
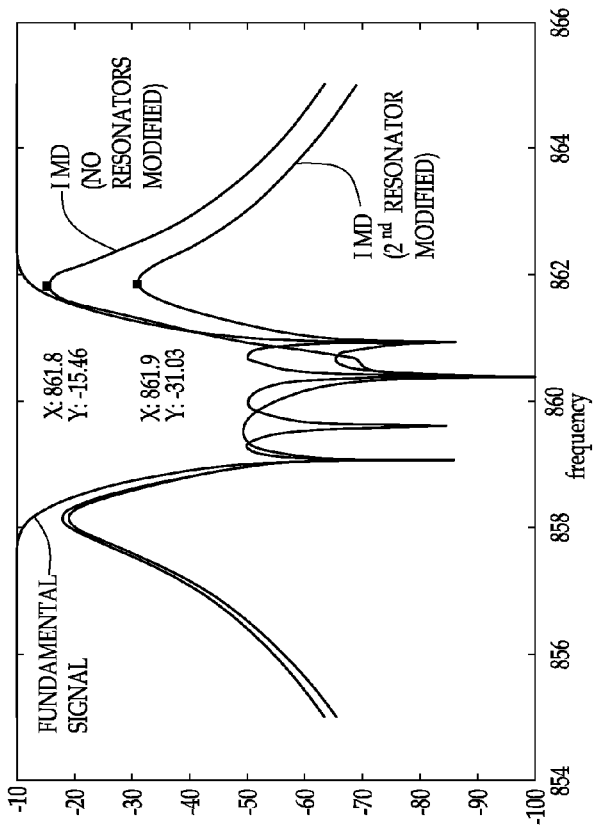
FIG. 15 is the computed frequency response of the fundamental signal, IMD using identical resonators, and IMD using a second modified resonator.
Figure 14:
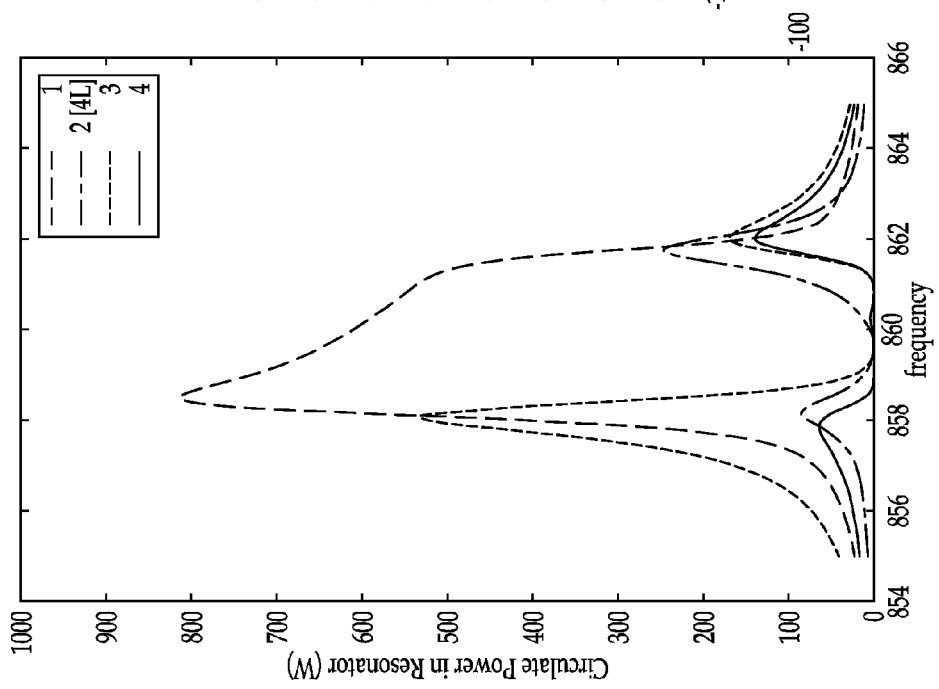
FIG. 14 is the computed frequency response of the resonator powers within the band-stop of FIG. 11, wherein the second resonator has been modified.

As can be appreciated by the comparison of resonator powers in FIG. 14 to the resonator powers in FIG. 13, the power within the second resonator $B_2^R$ within the modified filter (FIG. 14) has been substantially reduced as compared to the power within the second resonator $B_2^R$ within the conventional filter (FIG. 13). Because the remaining resonators within the modified filter are identical to those in the conventional filter, the power within these resonators are substantially the same for the conventional filter and modified filter. As shown in FIG. 15, simply using an improved resonator for the second resonator $B_2^R$ can greatly improve the IMD at the higher frequency side of the stopband from −15.46 dBm to −31.03 dBm. Thus, if this stopband filter is used on the lower frequency side of a passband, the IMD within the lower frequency side of the passband will be substantially reduced.

Figure 16:
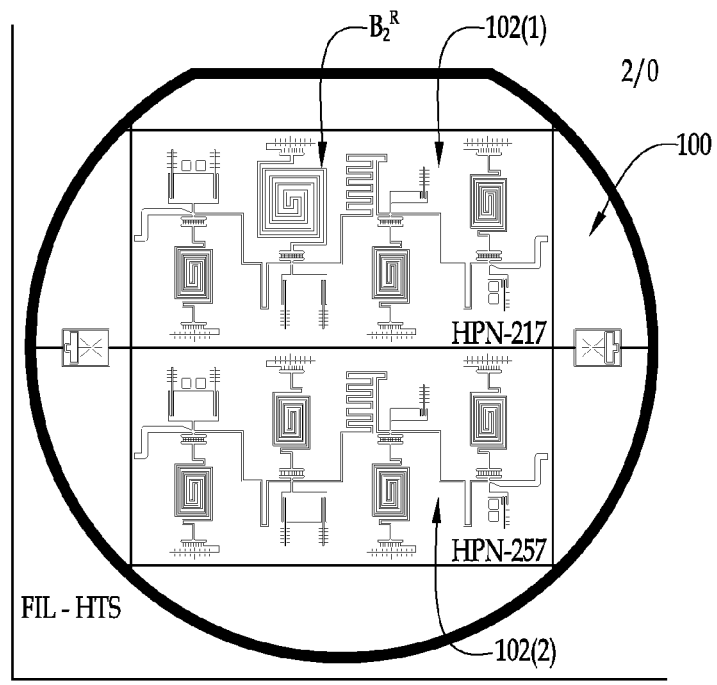
FIG. 16 is a circuit diagram of a band-pass filter constructed using two of the band-stop filters of FIG. 5.
Figure 17:
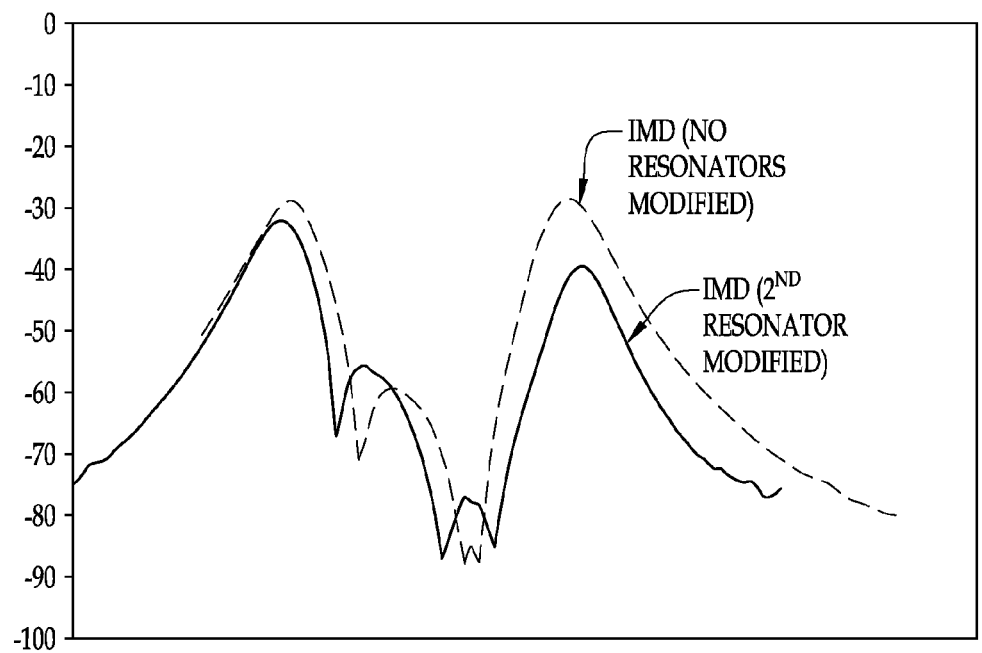
FIG. 17 is the measured frequency response of the IMDs of the band-stop filter used in the band-pass filter of FIG. 16.

The results shown in FIG. 15 were confirmed experimentally by fabricating the set of band-stop filters 100 shown in FIG. 16 using a planar, high temperature superconducting (HTS) structure. The set of band-stop filters 100 includes two band-stop filters: a conventional band-stop filter 102(1) and a modified band-stop filter 102(2), both filters were fabricated on the same HTS wafer to eliminate any wafer-to-wafer variations. The band-stop filters 102(1), 102(2) were designed to have a frequency response with a nominally identical forward transmission coefficient $S_{21}$. The second resonator $B_2^R$ within the modified band-stop filter 102(1), however, was formed from a transmission line having a width that is 2.5 times the width of the transmission line used to form the remaining resonators. The frequency response for the total third order IMD was measured at the outputs of the respective band-stop filters 102(1), 102(2), and as shown in FIG. 17, the third order IMD at the high frequency side of the modified band-stop filter 102(1) is substantially improved over that of the conventional band-stop filter 102(2).

Although the method of designing the stop-band filter 10 has been described above for use with planar HTS filters, it should be noted that this method is generally applicable to any method of realization of RF filters, including, but not limited: cavity filters, coaxial filters, combline filters, airline filters, dielectric puck filters, Micro Electro-Mechanical Systems (MEMS) filters, Surface Acoustic Wave (SAW) filters, Film Bulk Acoustic Resonator (FBAR) filters, bulk acoustic wave filters, and quasi-lumped element filters.

Although particular embodiments of the present invention have been shown and described, it should be understood that the above discussion is not intended to limit the present invention to these embodiments. It will be obvious to those skilled in the art that various changes and modifications may be made without departing from the spirit and scope of the present invention. For example, the present invention has applications well beyond filters with a single input and output, and particular embodiments of the present invention may be used to form duplexers, multiplexers, channelizers, reactive switches, etc., where low-loss selective circuits may be used. Thus, the present invention is intended to cover alternatives, modifications, and equivalents that may fall within the spirit and scope of the present invention as defined by the claims.

What is claimed is:

1. A method of constructing a radio frequency (RF) band-stop filter, comprising:
designing a band-stop filter that includes a signal transmission path having an input and an output, a plurality of resonant elements disposed along the signal transmission path between the input and the output, and a plurality of non-resonant elements coupling the plurality of resonant elements together to form a stopband having a plurality of transmission zeroes corresponding to respective frequencies of the plurality of resonant elements;
changing the order in which the plurality of resonant elements are disposed along the signal transmission path to create a plurality of filter solutions;
computing a performance parameter for each of the filter solutions;
comparing the performance parameters to each other;
selecting one of the filter solutions based on the comparison of the computed performance parameters; and
constructing the band-stop filter using the selected filter solution.

2. The method of claim 1, wherein the number of the plurality of resonant elements in the band-stop filter is four.

3. The method of claim 1, wherein the plurality of non-resonant elements comprises a first set of non-resonant elements respectively coupled in in series between the input and the output, a second set of non-resonant elements respectively coupled in series with the plurality of resonant elements, and a third set of non-resonant elements respectively coupled in parallel with the plurality of resonant elements.

4. The method of claim 3, wherein each non-resonant element in the first and second sets of non-resonant elements is an admittance inverter, and each non-resonant element in the third set of non-resonant elements is a susceptance.

5. The method of claim 3, further comprises generating a coupling matrix representation for each of the filter solutions, wherein the performance parameter for each of the filter solutions is computed from the respective coupling matrix representation.

6. The method of claim 5, wherein the filter design includes nodes respectively between the first set of non-resonant elements, nodes respectively between the plurality of resonant elements and the second set of non-resonant elements, and nodes at the input and output, wherein each dimension of the coupling matrix includes the nodes.

7. The method of claim 6, further comprising reducing each coupling matrix to its simplest form, and determining whether the reduced coupling matrices are different relative to each other.

8. The method of claim 1, wherein the band-stop filter comprises a thin-film quasi-lumped element structure.

9. The method of claim 8, wherein the thin-film quasi-lumped element structure comprises a high temperature superconductor (HTS).

10. The method of claim 1, wherein the performance parameter is an intermodulation distortion performance parameter.

11. A method of improving the performance of a band-pass radio frequency (RF) filter, comprising coupling the band-stop filter of claim 1 to the band-pass filter in a manner that sharpens an edge of a pass-band created by the band-pass filter.

12. A radio frequency (RF) band-stop filter, comprising:
a plurality of resonant elements coupled together to form a stopband, wherein at least two of the plurality of resonant elements have third order intermodulation distortion (IMD) components different from each other, such that the third order IMD components of the filter are asymmetrical about the stopband.

13. The band-stop filter of claim 12, wherein the third order IMD components are third order IMD products $2f_2-f_1$ and $2f_1-f_2$, wherein $f_1$ is a first input signal frequency and $f_2$ is a second input signal frequency.

14. The band-stop filter of claim 12, wherein first one of the at least two resonant elements has a transmission line that differs from a transmission line of a second one of the at least two resonant elements by at least one wavelength.

15. A radio frequency (RF) filter network, comprising:
a band-pass filter configured for creating a passband;
a band-stop filter including a plurality of resonant elements coupled together to form a stopband, wherein at least two of the plurality of resonant elements have third order intermodulation distortion (IMD) components different from each other, such that the third order IMD components are asymmetrical about the stopband, wherein the band-pass filter and the band-stop filter are coupled together in a manner that sharpens one of the edges of the passband.

16. The filter network of claim 15, wherein the third order IMD components are third order IMD products $2f_2-f_1$ and $2f_1-f_2$, wherein $f_1$ is a first input signal frequency and $f_2$ is a second input signal frequency.

17. The filter network of claim 15, wherein first one of the at least two resonant elements has a transmission line that differs from a transmission line of a second one of the at least two resonant elements by at least one wavelength.

18. The filter network of claim 15, wherein the band-stop filter has first and second sets of third order intermodulation components on opposite sides of the respective stopband, the first set of intermodulation components being closer to the passband than the second set of intermodulation components, wherein the first set of intermodulation components are lower than the second set of intermodulation components.

19. The filter network of claim 18, wherein the first set of intermodulation components are at least 10 dB lower than the second set of intermodulation components.

20. The filter network of claim 15, further comprising another band-stop filter including another plurality of resonant elements coupled together to form another stopband, wherein at least two of the other plurality of resonant elements have other third order intermodulation distortion (IMD) components different from each other, such that the other third order IMD components are asymmetrical about the other stopband, wherein the band-pass filter and the other band-stop filter are coupled together in a manner that sharpens another one of the edges of the passband.

* * * * *